United States Patent
Seo et al.

(10) Patent No.: US 11,928,362 B2
(45) Date of Patent: Mar. 12, 2024

(54) FUSE LATCH OF SEMICONDUCTOR DEVICE FOR LATCHING DATA OF A REPAIR FUSE CELL

(71) Applicant: SK hynix Inc., Icheon-si (KR)

(72) Inventors: Jae Hwan Seo, Icheon-si (KR); Chul Moon Jung, Icheon-si (KR)

(73) Assignee: SK hynix inc., Icheon-si (KR)

( * ) Notice: Subject to any disclaimer, the term of this patent is extended or adjusted under 35 U.S.C. 154(b) by 161 days.

(21) Appl. No.: 17/557,009

(22) Filed: Dec. 20, 2021

(65) Prior Publication Data

US 2023/0067759 A1    Mar. 2, 2023

(30) Foreign Application Priority Data

Aug. 25, 2021    (KR) .................. 10-2021-0112084

(51) Int. Cl.
*G06F 3/06*    (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G11C 2029/4402; G11C 14/0054; G11C 17/16; G11C 17/18; G11C 29/787
See application file for complete search history.

(56) References Cited

U.S. PATENT DOCUMENTS

| | | | |
|---|---|---|---|
| 6,125,069 A | 9/2000 | Aoki | |
| 6,157,583 A | 12/2000 | Starnes et al. | |
| 7,538,368 B2* | 5/2009 | Yano | H01L 27/11807 257/E27.07 |
| 10,573,398 B1 | 2/2020 | Chun | |
| 2002/0122331 A1 | 9/2002 | Santin et al. | |
| 2003/0043648 A1* | 3/2003 | Tsuji | G11C 29/848 365/200 |

(Continued)

FOREIGN PATENT DOCUMENTS

| | | |
|---|---|---|
| CN | 1664955 A | 9/2005 |
| CN | 1710711 A | 12/2005 |
| CN | 101124705 A | 2/2008 |

(Continued)

OTHER PUBLICATIONS

First Notification of Office Action from China National Intellectual Property Administration for CN Application No. 202010625336.2 dated Apr. 26, 2023.

*Primary Examiner* — Sultana Begum

(57) ABSTRACT

A fuse latch of a semiconductor device including PMOS transistors and NMOS transistors includes a data transmission circuit configured to transmit data to a first node and a second node in response to a first control signal, a latch circuit configured to latch the data received from the data transmission circuit through the first node and the second node, and a data output circuit configured to output the data latched by the latch circuit in response to a second control signal. NMOS transistors contained in the data transmission circuit, the latch circuit, and the data output circuit may be formed in first, fourth, and fifth active regions, PMOS transistors are formed in second and third active regions, and the first to fifth active regions are sequentially arranged in a first direction.

4 Claims, 3 Drawing Sheets

(56) References Cited

U.S. PATENT DOCUMENTS

2011/0002187 A1    1/2011   Ku

FOREIGN PATENT DOCUMENTS

| CN | 102760494 A | 10/2012 |
| CN | 106611620 A | 5/2017 |
| CN | 109906484 A | 6/2019 |
| CN | 110910943 A | 3/2020 |
| KR | 10-2016-0010166 A | 1/2016 |
| KR | 10-2018-0051134 A | 5/2018 |

* cited by examiner

FUSE LATCH OF SEMICONDUCTOR DEVICE FOR LATCHING DATA OF A REPAIR FUSE CELL

CROSS-REFERENCE TO RELATED APPLICATION

This patent document claims the priority under 35 U.S.C. § 119 to, and benefits of, Korean patent application No. 10-2021-0112084, filed on Aug. 25, 2021, which is hereby incorporated by reference in its entirety as part of the disclosure of this patent document.

TECHNICAL FIELD

The technology and implementations disclosed herein generally relate to a fuse latch of a semiconductor device, and more particularly to a fuse latch for latching data of a repair fuse cell.

BACKGROUND

With rapid development of higher-performance electronic systems such as personal computers (PCs) or electronic communication systems, semiconductor devices implemented as data memory mounted to electronic systems have been developed for products having higher speeds and higher degrees of integration.

In order to implement semiconductor devices having higher degrees of integration, a function for efficiently arranging memory cells of a memory cell region within a limited region or space is of importance. However, another function related to efficiently arranging a peripheral circuit region (hereinafter referred to as a peripheral region), which is needed to operate memory cells, is more important than the function related to efficiently arranging memory cells of a memory cell region.

Many fuse-related circuits for repairing memory cells have been widely used in semiconductor devices. Therefore, the technology associated with efficiently arranging such fuse-related circuits to attain a regional gain of semiconductor devices is also of importance.

SUMMARY

Various embodiments of the disclosed technology relate to a fuse latch of a semiconductor device that is highly resistant to soft errors.

Various embodiments of the disclosed technology relate to a fuse latch having an improved structure to increase a regional gain of the semiconductor device.

In accordance with an embodiment of the disclosed technology, a fuse latch of a semiconductor device may include first and second NMOS transistors, each of which receives a first control signal through a gate terminal and transmits fuse cell data in response to the first control signal, a first inverter configured to include a first PMOS transistor and a third NMOS transistor coupled in series between a power supply voltage terminal and a ground voltage terminal with an input node of the first inverter coupled to the second NMOS transistor and an output node of the first inverter coupled to the first NMOS transistor, a second inverter configured to include a second PMOS transistor and a fourth NMOS transistor coupled in series between the power supply voltage terminal and the ground voltage terminal with an input node of the second inverter coupled to the output node of the first inverter and an output node of the second inverter coupled to the input node of the first inverter, a fifth NMOS transistor, with a gate terminal coupled to the input node of the first inverter and the output node of the second inverter and with a first terminal coupled to a data output terminal, and a sixth NMOS transistor configured to receive a second control signal through a gate terminal and to selectively couple the ground voltage terminal to a second terminal of the fifth NMOS transistor in response to the second control signal. The first active region, the second active region, the third active region, the fourth active region, and the fifth active region may be sequentially arranged in a first direction. A portion of the second and fourth NMOS transistors may be included in the first active region, a portion of the second PMOS transistor may be included in the second active region, a portion of the first PMOS transistor may be included in the third active region, a portion of the first and third NMOS transistors may be included in the fourth active region, and a portion of the fifth and sixth NMOS transistors may be included in the fifth active region.

In accordance with another embodiment of the disclosed technology, a fuse latch of a semiconductor device includes a data transmission circuit configured to transmit data to a first node and a second node in response to a first control signal, a latch circuit configured to latch the data received from the data transmission circuit through the first node and the second node, and a data output circuit configured to output the data latched by the latch circuit in response to a second control signal. NMOS transistors contained in the data transmission circuit, the latch circuit, and the data output circuit may be disposed in first, fourth, and fifth active regions, PMOS transistors are disposed in second and third active regions, and the first to fifth active regions are sequentially arranged in a first direction.

It is to be understood that both the foregoing general description, and the following detailed description, of the technology disclosed herein are illustrative and explanatory and intended to provide further explanation of the scope of the disclosure to those skilled in the art.

DETAILED DESCRIPTION

This patent document provides implementations and examples of a fuse latch of a semiconductor device to latch data of a repair fuse cell that may be used in configurations to substantially address one or more technical or engineering issues and to mitigate limitations or disadvantages encountered in other fuse latch designs. Some implementations of the disclosed technology suggest a fuse latch of a semiconductor device that is highly resistant to soft errors. Some implementations of the disclosed technology suggest a fuse latch having an improved structure so as to increase a regional gain of the semiconductor device. The disclosed technology provides various implementations of a fuse latch of a semiconductor device that can improve the structure of the fuse latch, thereby strengthening resistance to soft errors and increasing a regional gain of the semiconductor device.

Hereafter, various embodiments will be described with reference to the accompanying drawings. However, it should be understood that the disclosed technology is not limited to specifically disclosed embodiments, but also includes various modifications, equivalents and/or alternatives of the embodiments. The embodiments of the disclosed technology may provide a variety of effects capable of being directly or indirectly recognized through the disclosed technology.

Figure 1:
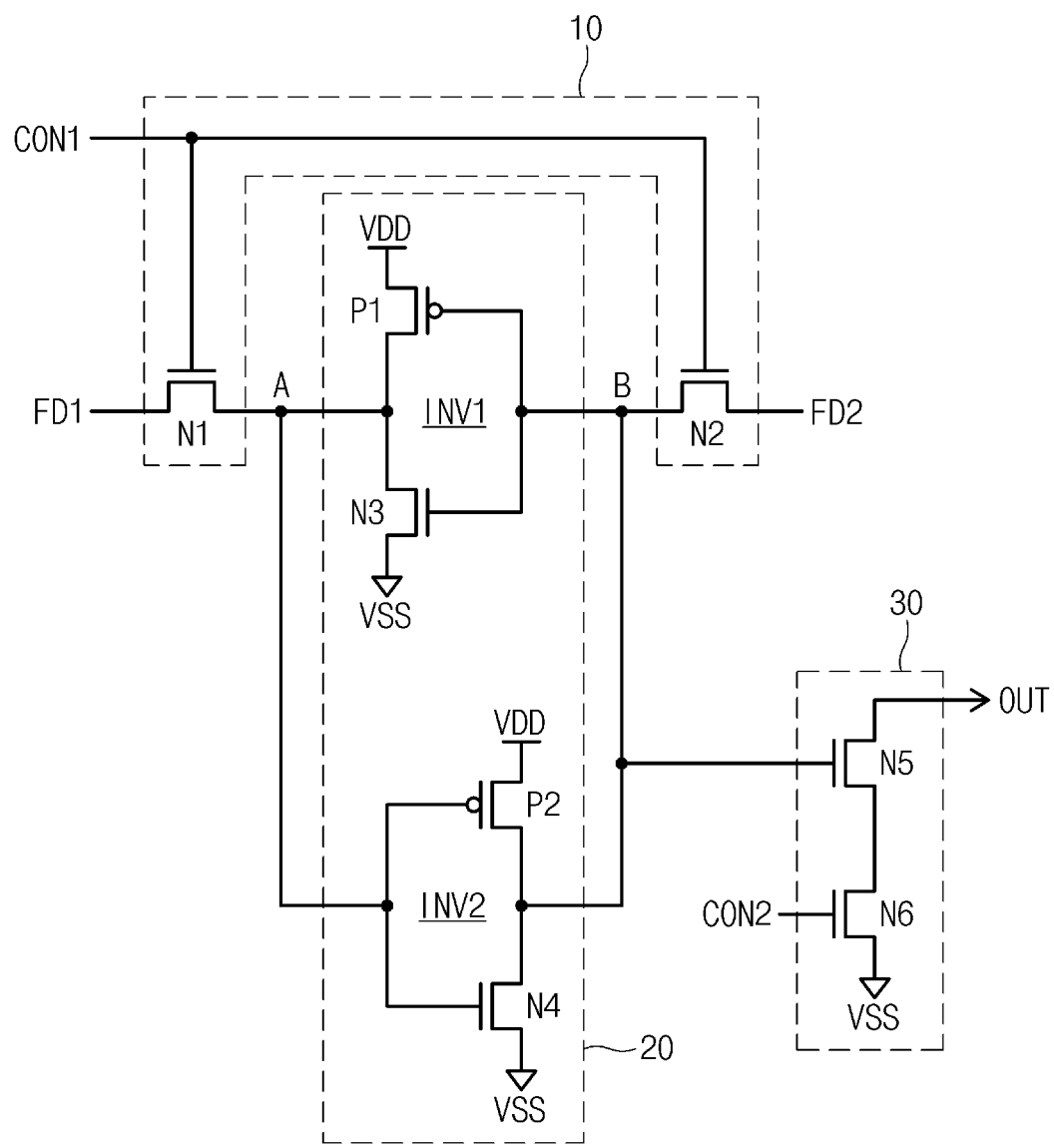
FIG. 1 is a circuit diagram illustrating an example of a circuit structure of a fuse latch of a semiconductor device in accordance with an embodiment of the disclosure.

FIG. 1 is a circuit diagram illustrating an example of a circuit structure of a fuse latch of a semiconductor device in accordance with an embodiment of the disclosure.

Embodiments contemplated by the present disclosure include a semiconductor device that has detected a defective memory cell (i.e., a defective cell), from among the memory cell arrays of the semiconductor device, through testing. In this disclosure, one or more addresses for accessing a defective cell will hereinafter be referred to as a repair information. The repair information may be stored in a fuse array (not shown) in units of a fuse set (i.e., on a fuse-set basis). A fuse latch may store the repair information. The fuse latch may read out the repair information pre-stored in the fuse array during a boot-up process of the semiconductor device.

Referring to FIG. 1, a fuse latch 1 may include a data transmission circuit 10, a latch circuit 20, and a data output circuit 30.

The data transmission circuit 10 may transmit fuse cell data FD1 and FD2 to the latch circuit 20 in response to a control signal (CON1). In this case, the fuse cell data FD1 may be opposite in value to the fuse cell data FD2. In an example, if the fuse cell data FD1 has a high-level phase (H), then the fuse cell data FD2 may transition to a low-level phase (L). The data transmission circuit 10 may include pass-purposed NMOS transistors N1 and N2.

The NMOS transistor N1 may include a gate terminal, a first terminal (hereinafter referred to as a drain terminal or a source terminal), and a second terminal (hereinafter referred to as a drain terminal or a source terminal). In an example, the gate terminal of NMOS transistor N1 may receive the control signal (CON1), the first terminal may receive fuse cell data FD1 by connecting to a first output terminal of a fuse cell (not shown), and the second terminal may be coupled to the latch circuit 20 through a node (A). The NMOS transistor N2 may include a gate terminal, a first terminal, and a second terminal. The gate terminal may receive the control signal (CON1), the first terminal may receive fuse cell data FD2 by connecting to a second output terminal of a fuse cell (not shown), and the second terminal may be coupled to the latch circuit 20 through a node (B).

If the control signal (CON1) is at a high level, then the NMOS transistors N1 and N2 may be turned on. As a result, the fuse cell data FD1 may be transmitted to the node (A), and the fuse cell data FD2 may be transmitted to the node (B).

The latch circuit 20 may latch fuse cell data FD1 and FD2 received from the data transmission circuit 10. The latch circuit 20 may include inverters INV1 and INV2, input/output (I/O) terminals of which are coupled to feed back to each other.

The inverter INV1 may include a PMOS transistor P1 and an NMOS transistor N3 that are coupled in series between a ground voltage (VSS) terminal and a power-supply voltage (VDD) terminal. A gate terminal of the PMOS transistor P1 and a gate terminal of the NMOS transistor N3 may be commonly coupled to a second terminal of the NMOS transistor N2 through the node (B). A first terminal of the PMOS transistor P1 may be coupled to the power-supply voltage (VDD) terminal, and the second terminal of the PMOS transistor P1 may be coupled to a second terminal of the NMOS transistor N3. A first terminal of the NMOS transistor N3 may be coupled to the ground voltage (VSS) terminal, and a second terminal of the NMOS transistor N3 may be coupled to a second terminal of the PMOS transistor P1.

A node to which the second terminal of the PMOS transistor P1 and the second terminal of the NMOS transistor N3 are commonly coupled to the node (A) of the inverter INV1, such that the node (A) may be coupled to the second terminal of the NMOS transistor N1. The commonly-coupled gate terminals of the PMOS transistor P1 and the NMOS transistor N3 are coupled to the node (B), such that the commonly-coupled gate terminals of the PMOS transistor P1 and the NMOS transistor N3 are coupled to the second terminal of the NMOS transistor N2.

The inverter INV2 may include a PMOS transistor P2 and an NMOS transistor N4 that are coupled in series between the ground voltage (VSS) terminal and the power-supply voltage (VDD) terminal. Gate terminals of the PMOS transistor P2 and the NMOS transistor N4 may be commonly coupled to the second terminal of the NMOS transistor N1 through the node (A). The first terminal of the PMOS transistor P2 may be coupled to the power-supply voltage (VDD) terminal, and the second terminal of the PMOS transistor P2 may be coupled to the second terminal of the NMOS transistor N4. The first terminal of the NMOS transistor N4 may be coupled to the ground voltage (VSS) terminal, and the second terminal of the NMOS transistor N4 may be coupled to the second terminal of the PMOS transistor P2.

A node to which the second terminal of the PMOS transistor P2 and the second terminal of the NMOS transistor N4 are commonly coupled to the node (B) of the inverter INV2, such that the node (B) may be coupled to the second terminal of the NMOS transistor N2. The commonly-coupled gate terminals of the PMOS transistor P2 and the NMOS transistor N4 are coupled to the node (B), such that the commonly-coupled gate terminals of the PMOS transistor P2 and the NMOS transistor N4 are coupled to the second terminal of the NMOS transistor N1.

If the node A is at a high level, then the NMOS transistor N4 of the inverter INV2 may be turned on. As a result, the node B may transition to a logic low level, such that the PMOS transistor P1 may be turned on. If the PMOS transistor P1 is turned on, the node A may remain at a high level, such that the latch circuit 20 may latch high-level data.

In contrast, if the node A is at a low level, then the PMOS transistor P2 of the inverter INV2 may be turned on. As a result, the node B may transition to a logic high level, such that the NMOS transistor N3 may be turned on. If the NMOS transistor N3 is turned on, the node A may remain at a low level, such that the latch circuit 20 may latch low-level data.

The data output circuit 30 may output data latched by the latch circuit 20 in response to a control signal (CON2). The data output circuit may include NMOS transistors N5 and N6 coupled in series between the data output terminal (OUT) and the ground voltage (VSS) terminal.

The NMOS transistor N5 may include a gate terminal coupled to the node B, a first terminal coupled to the data output terminal (OUT), and a second terminal coupled to the NMOS transistor N6. The NMOS transistor N6 may include a gate terminal receiving the control signal (CON2), a first terminal coupled to the ground voltage (VSS) terminal, and a second terminal coupled to the second terminal of the NMOS transistor N5.

If the control signal (CON2) is at a high level, then the NMOS transistor N6 may be turned on. If the node B transitions to a high level, the NMOS transistor N5 is turned on, such that the latched low-level data is transmitted to the output terminal (OUT).

Figure 2:
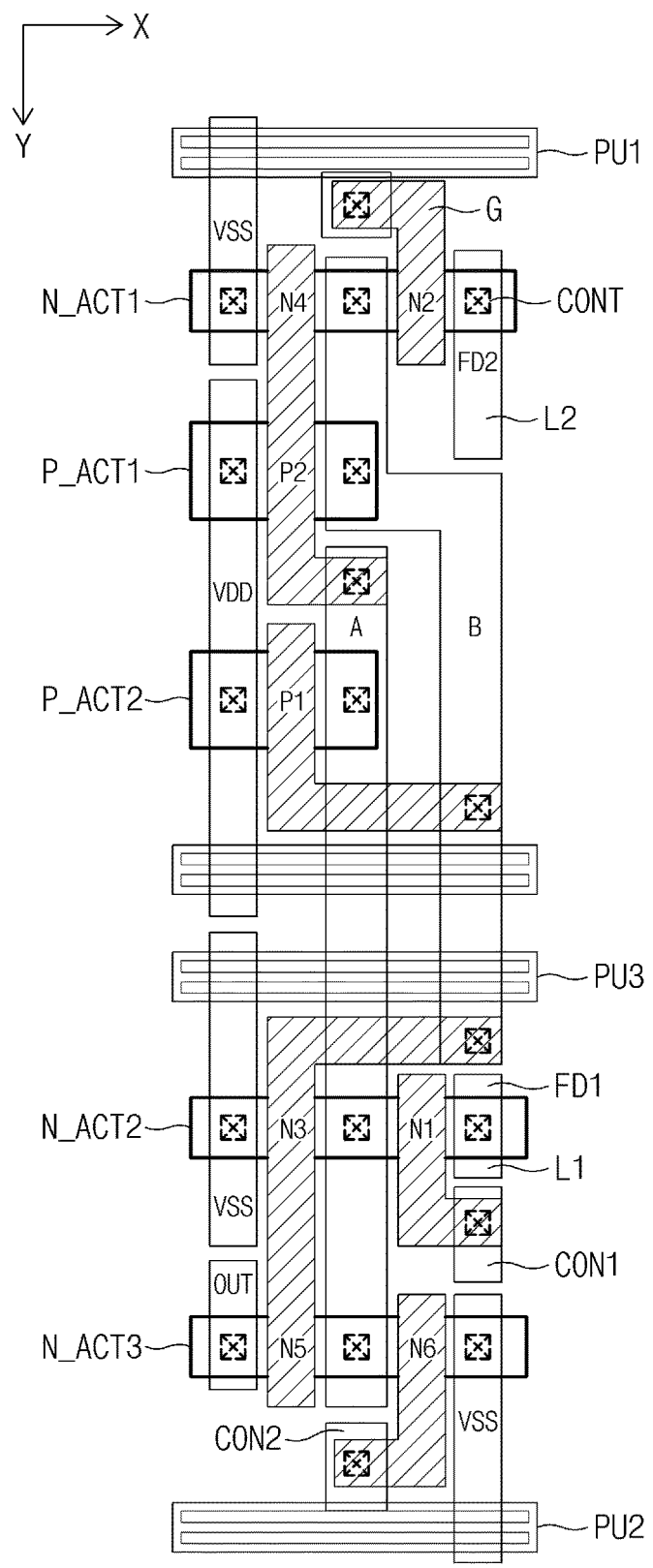
FIG. 2 is a layout diagram illustrating an example of an arrangement of constituent elements of the fuse latch of FIG. 1 in accordance with an embodiment of the disclosure.

FIG. 2 is a layout diagram illustrating an example of an arrangement of constituent elements of the fuse latch of FIG. 1 in accordance with an embodiment of the disclosure.

For convenience of description, reference numerals indicating PMOS transistors P1 and P2 and NMOS transistors N1~N6 shown in FIG. 1 are written at gate terminals of the corresponding transistors shown in FIG. 2. In FIG. 2, source regions and drain regions of the PMOS transistors P1 and P2 and the NMOS transistors N1~N6 are disposed in the active region, however, other implementations are also possible. If necessary, other transistors can also be disposed in the active region, but these are not included in FIG. 2 for convenience of description.

Referring to FIG. 2, an NMOS transistor N1 of a data transmission circuit 10 may be formed in an N-type active region N_ACT2, and an NMOS transistor N2 of the data transmission circuit 10 may be formed in an N-type active region N_ACT1. The N-type active region N_ACT1 corresponding to the NMOS transistor N2 may be isolated, and the N-type active region N_ACT2 corresponding to the NMOS transistor N1 may be isolated.

A PMOS transistor P1 of a latch circuit 20 may be formed in a P-type active region P_ACT2. A PMOS transistor P2 may be formed in a P-type active region P_ACT1. The P-type active region P_ACT1 corresponding to the PMOS transistor P2 may be isolated, and the P-type active region P_ACT2 corresponding to the PMOS transistor P1 may be isolated. That is, two PMOS transistors P2 and P1 respectively included in the inverters INV1 and INV2 may be respectively formed in the P-type active regions P_ACT1 and P_ACT2. In more detail, one PMOS transistor P2 included in the inverter INV1 may be formed in the P-type active region P_ACT1, and the other PMOS transistor P1 included in the inverter INV2 may be formed in the P-type active region P_ACT2.

An NMOS transistor N3 of the latch circuit 20 may be formed in the N-type active region N_ACT2. An NMOS transistor N4 may be formed in the N-type active region N_ACT1. The N-type active region N_ACT2 corresponding to the NMOS transistor N3 may be isolated, and the N-type active region N_ACT1 corresponding to the NMOS transistor N4 may be isolated. That is, two NMOS transistors N3 and N4 contained in different inverters INV1 and INV2 respectively may be formed in N-type active regions N_ACT2 and N_ACT1. In detail, the NMOS transistor N3 included in the inverter INV1 may be formed in the N-type active region N_ACT2, and the NMOS transistor N4 included in the inverter INV2 may be formed in the N-type active region N_ACT1.

NMOS transistors N5 and N6 contained in a data output circuit 30 may be formed in an N-type active region N_ACT3. The gate terminal of the NMOS transistor N5 may be commonly coupled to the gate terminal of the NMOS transistor N3.

The N-type active region N_ACT1 may be disposed at one side of the P-type active region P_ACT1 in a first direction (Y-axis direction). The P-type active region P_ACT1 may be disposed in the first direction (Y-axis direction) between the N-type active region N_ACT1 and the P-type active region P_ACT2. The P-type active region P_ACT2 may be disposed in the first direction between the P-type active region P_ACT1 and the N-type active region N_ACT2.

The N-type active region N_ACT2 may be disposed at the other side (i.e., opposite to the P-type active region P_ACT1) of the P-type active region P_ACT2 in the first direction. The N-type active region N_ACT2 may be disposed in the first direction between the P-type active region P_ACT2 and the N-type active region N_ACT3.

In other words, in each fuse latch (i.e., a unit fuse latch) 1, the NMOS transistors N1~N6 may be formed in three N-type active regions N_ACT1, N_ACT2, and N_ACT3. The PMOS transistors P1 and P2 may be formed in two P-type active regions P_ACT1 and P_ACT2.

In addition, the line B corresponding to a node B may be coupled to the N-type active region N_ACT1 and to P-type active region P_ACT1, in each case through a contact (CONT). The line A corresponding to a node A may be coupled to the P-type active region P_ACT2 and to the N-type active regions N_ACT2 and N_ACT3, in each case through a contact CONT. Due to the above-mentioned arrangement structure, junctions of the line B and the line A of the inverters INV1 and INV2 shown in FIG. 1 may be separated from each other. For example, the line B corresponding to the node B, and the line A corresponding to the node A, may be formed of metal lines denoted by M0 layers. Each of the line B and the line A may be formed to be thicker than the other lines in the second direction (X-axis direction), resulting in an increase in capacitance.

The N-type active region N_ACT1 formed in one stage may be located at one side of the P-type active region P_ACT1 in the Y-axis direction. The P-type active regions P_ACT1 and P_ACT2 formed in two stages may be spaced apart from the N-type active region N_ACT1 in the Y-axis direction. The N-type active regions N_ACT2 and N_ACT3 formed in two stages may be spaced apart from the P-type active region P_ACT2 in the Y-axis direction away from the P-type active region P_ACT1. Therefore, the active regions N_ACT1, P_ACT1, P_ACT2, N_ACT2, and N_ACT3 may be sequentially arranged in the order of N→P→P→N→N.

In the second direction (e.g., X-axis direction) perpendicular to the first direction (e.g., Y-axis direction), a length of the P-type active regions P_ACT1 and P_ACT2 may be shorter than a length of N-type active regions N_ACT1~N_ACT3. In the second direction, a total length of the P-type active region P_ACT1 may be identical to a total length of the P-type active region P_ACT2. In addition, the total lengths of the N-type active regions N_ACT1~N_ACT3 may be identical to each other.

In addition, because the N-type active region N_ACT1 is disposed at the highest outer wall (i.e., the uppermost outer wall) of the fuse latch 1, a pickup guard ring region PU1 for picking up a PMOS well may be located near the N-type active region N_ACT1. In a similar example, the N-type active region N_ACT3 is disposed at the lowest outer wall (i.e., the lowermost outer wall) of the fuse latch 1, so a pickup guard ring region PU2 for picking up a PMOS well may be located near the N-type active region N_ACT3. For example, the pickup guard ring region PU1 may be located adjacent to the N-type active region N_ACT1 in the first direction, and the pickup guard ring region PU2 may be located adjacent to the N-type active region N_ACT3 in the first direction, so that the amount of electrons flowing out of the source node (Node A) can be reduced. In addition, in the first direction (Y-axis direction), a pickup guard ring region PU3 for picking up a PMOS well may be optionally disposed at one side of the N-type active region N_ACT2.

Figure 3:
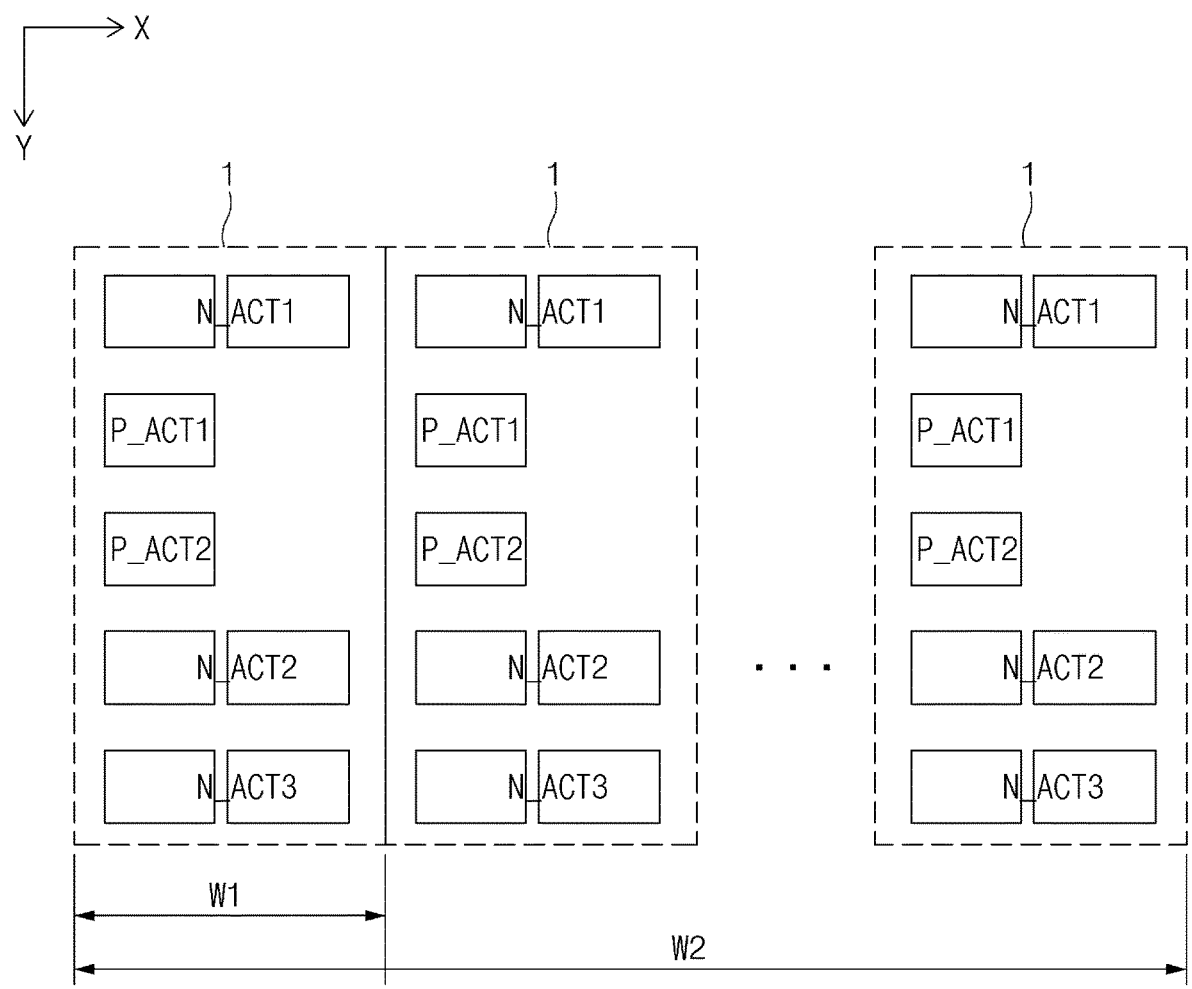
FIG. 3 is a schematic diagram illustrating an example of an array-like arrangement structure of active regions of unit fuse latches of FIG. 2 in accordance with an embodiment of the disclosure.

FIG. 3 illustrates active regions N_ACT1, P_ACT1, P_ACT2, N_ACT2, and N_ACT3 that are sequentially arranged in the N-P-P-N-N structure in the first direction (i.e., Y-axis direction). However, the scope or spirit of the disclosed technology is not limited thereto, and the active regions N_ACT1, P_ACT1, P_ACT2, N_ACT2, and N_ACT3 can also be arranged in the N-P-P-N-N structure in the first direction (i.e., Y-axis direction), or in various other configurations.

A fuse latch may be affected by electric charges generated by exposure to ionizing radiation. Ionizing radiation may be caused by alpha rays (α-rays) emitted from a package material or a wiring material. Due to irradiation with the ionizing radiation, the storage state of a latch circuit becomes unstable, so that there is a higher possibility of malfunction, which can be referred to as reversal of the storage state. The above-mentioned phenomenon may be called soft errors, and a soft error may indicate that data stored in the latch circuit is changed by cosmic rays such as alpha (α) particles. If reversal of data frequently occurs in the fuse latch, then a neutron soft error rate (NSER) may increase. In particular, the lower the power-supply voltage, the higher the possibility of soft errors. As a result, increasing resistance to soft errors in the semiconductor memory devices that are driven with a lower power-supply voltage is considered very important.

Referring again to FIGS. 1 and 2, in the N-type active regions N_ACT1 and N_ACT2, the first terminals L1 and L2 of the NMOS transistors N1 and N2 respectively receive the fuse cell data FD1 and FD2. The first terminals L1 and L2 may be physically spaced apart from each other in the first direction by a predetermined distance based on the node B. In other words, the NMOS transistors N1 and N2 that receive the fuse cell data FD1 and FD2 may not be formed in the same active region, and may be formed in different active regions N_ACT1 and N_ACT2 respectively. This arrangement structure may have a higher resistance to soft errors in the fuse latch 1.

In more detail, in a situation where junction lines, such as the first terminals L1 and L2, are physically isolated from each other and spaced apart from each other, although soft errors occur in the junction lines, extra charges generated by such soft errors in one junction line (e.g., L1) can be prevented from diffusing into the signal line (e.g., fuse cell data FD2) of the other junction line (e.g., L2). Even though soft errors occur, it is difficult for signal lines of the NMOS transistors N1 and N2 to transmit and receive erroneous states, so that reversal of the data storage state can be prevented from occurring in the connection lines. As a result, such soft errors do not directly affect the operation of the latch circuit.

In addition, in the N-type active regions N_ACT1 and N_ACT2, first terminals of the NMOS transistors N1 and N2 respectively receiving the fuse cell data FD1 and FD2 may be disposed in the second direction (i.e., the X-axis direction) near an end of the N-type active regions N_ACT1 and N_ACT2, respectively. Therefore, when fuse latches are arranged in an array-shaped layout in the disclosed structures, adjacent fuse latches may share input terminals (i.e., signal transmission lines) for the fuse cell data FD1 and FD2.

In addition, power lines for providing the power-supply voltage (VDD) and the ground voltage (VSS) may be disposed at on the outermost sides of each fuse latch to facilitate an array-shaped layout of the fuse latches so that adjacent fuse latches may share the corresponding power lines.

In FIG. 2, transmission lines of the fuse data FD1 and FD2 and the control signals CON1 and CON2, and other transmission lines needed for transmission of the power-supply voltages VDD and VSS, may be formed of metal lines denoted by MO layers (not illustrated). The lines may be coupled to the gate terminal (G) or to the active regions P_ACT1, P_ACT2, N_ACT1, N_ACT2, and N_ACT3, in each instance through a contact (CONT).

In some implementations, two NMOS transistors N1 and N2 may be disposed in the second direction (i.e., X-axis direction) over the N-type active region N_ACT1. In some implementations, one PMOS transistor P2 may be disposed over the P-type active region (P_ACT1) in the second direction (i.e., X-axis direction). In some implementations, one PMOS transistor P1 may be disposed over the P-type active region (P_ACT2) in the second direction (i.e., X-axis direction). In some implementations, two NMOS transistors N3 and N1 may be disposed over the N-type active region N_ACT2 in the second direction (i.e., X-axis direction). In some implementations, two NMOS transistors N5 and N6 may be disposed over the N-type active region N_ACT3 in the second direction (i.e., X-axis direction).

For example, NMOS transistors arranged in a shape of two lines may be disposed in one active region in the second direction (i.e., X-axis direction), and PMOS transistors arranged in a shape of one line may be disposed in the other active region in the second direction (i.e., X-axis direction), such that the second direction (i.e., X-axis direction) can be greatly reduced in width.

FIG. 3 is a schematic diagram illustrating an example of an array-like arrangement structure of active regions of unit fuse latches of FIG. 2 in accordance with an embodiment of the disclosure.

Referring to FIG. 3, each unit fuse latch 1 may include an N-type active region (N_ACT1), P-type active regions (P_ACT1, P_ACT2), and N-type active regions (N_ACT2, N_ACT3) that are sequentially arranged in the order of N→P→P→N→N in the first direction (i.e., Y-axis direction). The fuse latch array may include a plurality of unit fuse latches 1 arranged in one line or row in the second direction (i.e., X-axis direction).

As described above, because the active regions of each unit fuse latch 1 are arranged in the N-P-P-N-N structure in the Y-axis direction, the width (W1) of the unit fuse latch 1 can be reduced or shortened in the X-axis direction. Specifically, if the unit fuse latches 1 in the array are arranged in one line or row, then the width (W2) of the fuse latch array can be greatly reduced or shortened.

As is apparent from the above description, a fuse latch of the semiconductor device based on some implementations of the disclosed technology can improve the structure of the fuse latch, thereby strengthening resistance to soft errors and increasing a regional gain of the semiconductor device.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, variations and enhancements to the disclosed embodiments and other embodiments can be made based on what is disclosed in this patent document.

What is claimed is:

1. A fuse latch of a semiconductor device comprising:
a data transmission circuit configured to transmit data to a first node and a second node in response to a first control signal and to include a first NMOS transistor and a second NMOS transistor;
a latch circuit configured to latch the data received from the data transmission circuit through the first node and the second node and to include a first PMOS transistor, a third NMOS transistor, a second PMOS transistor, and a fourth NMOS transistor; and
a data output circuit configured to output the data latched by the latch circuit in response to a second control signal and to include a fifth NMOS transistor and a sixth NMOS transistor,
wherein at least a portion of the first to sixth NMOS transistors are disposed in first, fourth, and fifth active regions, the first and second PMOS transistors are disposed in second and third active regions, and the first to fifth active regions are sequentially arranged in a first direction,
wherein the first to sixth NMMOS transistors are arranged in two columns in each of the first, fourth, and fifth active regions along a second direction intersecting the first direction; and
wherein the first and second PMOS transistors are arranged in one column in each of the second and third active regions along the second direction.

2. The fuse latch of the semiconductor device according to claim 1, wherein:
at least some parts of the second and fourth NMOS transistors are disposed in the first active region;
at least some parts of the second PMOS transistor are disposed in the second active region arranged at one side of the first active region in the first direction;
at least some parts of the first PMOS transistor are disposed in the third active region arranged at one side of the second active region in the first direction;
at least some parts of the first and third NMOS transistors are disposed in the fourth active region arranged at one side of the third active region in the first direction; and
at least some parts of the fifth and sixth NMOS transistors are disposed in the fifth active region arranged at one side of the fourth active region in the first direction.

3. The fuse latch of the semiconductor device according to claim 1, further comprising:
a first line disposed at an end of the fourth active region in the second direction, and configured to supply the data in the second direction;
a second line disposed at an end of the first active region in the second direction, and configured to supply the data in the second direction;
a first power-supply line disposed at an end of the second and third active regions in the second direction, and configured to supply a power-supply voltage;
a second power-supply line disposed at an other end of the first active region in the second direction, and configured to supply a ground voltage;
a third power-supply line disposed at an other end of the fourth active region in the second direction, and configured to supply the ground voltage in the second direction; and
a fourth power-supply line disposed at an end of the fifth active region in the second direction, and configured to supply the ground voltage.

4. The fuse latch of the semiconductor device according to claim 3, wherein:
the second and third active regions are disposed between the first active region and the fourth active region in the first direction; and
the first line and the second line are spaced apart from each other in the first direction by a distance between the first active region and the fourth active region.

* * * * *